United States Patent
Lyu et al.

(10) Patent No.: US 11,085,979 B1
(45) Date of Patent: Aug. 10, 2021

(54) SYSTEM AND METHOD FOR MAGNETIC RESONANCE IMAGING WITH RADIAL SAMPLING OF K-SPACE

(71) Applicant: UIH AMERICA, INC., Houston, TX (US)

(72) Inventors: Jingyuan Lyu, Houston, TX (US); Yu Ding, Houston, TX (US); Xiaomao Gong, Shanghai (CN); Qi Liu, Houston, TX (US); Jian Xu, Houston, TX (US); Weiguo Zhang, Houston, TX (US)

(73) Assignee: UIH AMERICA, INC., Houston, TX (US)

( * ) Notice: Subject to any disclaimer, the term of this patent is extended or adjusted under 35 U.S.C. 154(b) by 0 days.

(21) Appl. No.: 16/798,487

(22) Filed: Feb. 24, 2020

(51) Int. Cl.
    *G01R 33/48* (2006.01)
    *G01R 33/54* (2006.01)

(52) U.S. Cl.
    CPC ..... *G01R 33/4824* (2013.01); *G01R 33/4822* (2013.01); *G01R 33/543* (2013.01)

(58) Field of Classification Search
    CPC ............ G01R 33/4824; G01R 33/4822; G01R 33/543
    See application file for complete search history.

(56) References Cited

U.S. PATENT DOCUMENTS

| | | | |
|---|---|---|---|
| 9,921,285 B2 | 3/2018 | Otazo et al. | |
| 2013/0006098 A1* | 1/2013 | Schmitt | G01R 33/5635 600/419 |
| 2016/0041242 A1* | 2/2016 | Stemmer | G01R 33/4824 324/309 |

OTHER PUBLICATIONS

Kai Tobias Block et al., Towards Routine Clinical Use of Radial Stack-of-Stars 3D Gradient-Echo Sequences for Reducing Motion Sensitivity, JKSMRM, 18(2): 87-106, 2014.

Li Feng et al., Golden-Angle Radial Sparse Parallel MRI: Combination of Compressed Sensing, Parallel Imaging, and Golden-Angle Radial Sampling for Fast and Flexible Dynamic Volumetric MRI, Magnetic Resonance in Medicine, 72(3): 707-717, 2014.

* cited by examiner

*Primary Examiner* — G. M. A Hyder
(74) *Attorney, Agent, or Firm* — Metis IP LLC

(57) ABSTRACT

Systems and methods for generating an image of a subject using a magnetic resonance imaging (MRI) device may be provided. The method may include obtaining a radial sampling scheme including a plurality of radial lines that each pass through a center of k-space. The method may include selecting the plurality of radial lines of the radial sampling scheme. Each of the plurality of radial lines may be selected in a random and unrepeatable manner. The method may include acquiring k-space data along the selected radial lines. The method may include reconstructing at least one image of the subject based on the acquired k-space data.

20 Claims, 11 Drawing Sheets

SYSTEM AND METHOD FOR MAGNETIC RESONANCE IMAGING WITH RADIAL SAMPLING OF K-SPACE

TECHNICAL FIELD

This disclosure generally relates to magnetic resonance imaging (MRI), and more particularly, to systems and methods for acquiring k-space data for MRI in a random and unrepeatable manner.

BACKGROUND

Magnetic resonance imaging (MRI) is a widely used medical technique which produces images of a region of interest (ROI) by exploiting a powerful magnetic field and radio frequency (RF) techniques. During an MRI session, the acquired signals can be processed and filled into k-space, then the k-space data can be transformed to reconstruct MR images. The quality of the k-space data can directly affect the quality of the reconstructed images. During k-space data acquisition, a relatively uniform k-space coverage facilitates the reconstruction of high quality MR images, such as an artifact-free image. Therefore, it is desirable to develop a data acquisition scheme for acquiring uniform k-space coverage and reconstruct the images based on the uniform k-space data, which can improve the quality of the images.

SUMMARY

In a first aspect of the present disclosure, a system is provided. The system may include at least one storage device storing a set of instructions and at least one processor in communication with the at least one storage device. When executing the set of instructions, the at least one processor may direct the system to perform one or more operations as the following. The at least one processor may obtain a radial sampling scheme including a plurality of radial lines that each pass through a center of k-space. Adjacent ones of the plurality of radial lines can be spaced by a baseline angular increment. The at least one processor may select the plurality of radial lines of the radial sampling scheme. Each of the plurality of radial lines may be selected in a random and unrepeatable manner. Successive selected radial lines may be spaced by an integral multiple of the baseline angular increment. The at least one processor may acquire k-space data along the selected radial lines. The at least one processor may reconstruct at least one image of the subject based on the acquired k-space data.

In some embodiments, the at least one processor may generate a set of azimuthal angles corresponding to the plurality of radial lines of the radial sampling scheme. The at least one processor may select a first radial line corresponding to a first azimuthal angle from the set of azimuthal angles randomly. The at least one processor may select a second radial line corresponding to a second azimuthal angle from the set of azimuthal angles excluding the first azimuthal angle randomly. The at least one processor may select a k-th radial line corresponding to a k-th azimuthal angle from the set of azimuthal angles excluding previous selected k−1 azimuthal angles. The k-th azimuthal angle may be determined based on at least one random probability derived from intersection angles formed between adjacent ones of previous selected k−1 radial lines. In some embodiments, 3≤k≤N, k is an integer and N is indicative of the number of the plurality of radial lines of the radial sampling scheme.

In some embodiments, a sum of the intersection angles may be equal to Tr.

In some embodiments, the at least one processor may determine a random probability corresponding to each of the intersection angles formed between adjacent ones of the previous selected k−1 radial lines. The at least one processor may generate a random value. The at least one processor may determine a reference azimuthal angle based on the random value and an intersection angle corresponding to a maximum random probability. The at least one processor may determine, based on the reference azimuthal angle, the k-th azimuthal angle from the set of azimuthal angles excluding previous selected k−1 azimuthal angles. The at least one processor may select the k-th radial line corresponding to the k-th azimuthal angle.

In some embodiments, the random value may be in a range of 0 to 1.

In some embodiments, the number of the plurality of radial lines of the radial sampling scheme, N, may be determined based on a desired image resolution.

In some embodiments, N may be equal to a maximum integer closing to a product of π and a coefficient of the desired image resolution.

In some embodiments, N may be equal to a maximum integer closing to a product of π/2 and a coefficient of the desired image resolution.

In some embodiments, the baseline angular increment may be determined based on the number of the plurality of radial lines of the radial sampling scheme.

In some embodiments, the at least one processor may acquire the k-space data in accordance with a sequence of the selected radial lines.

In a second aspect of the present disclosure, a method is provided. The method may include one or more operations. The one or more operations may be implemented on a computing device having at least one processor and at least one storage device. The at least one processor may obtain a radial sampling scheme including a plurality of radial lines that each pass through a center of k-space. Adjacent ones of the plurality of radial lines can be spaced by a baseline angular increment. The at least one processor may select the plurality of radial lines of the radial sampling scheme. Each of the plurality of radial lines may be selected in a random and unrepeatable manner. Successive selected radial lines may be spaced by an integral multiple of the baseline angular increment. The at least one processor may acquire k-space data along the selected radial lines. The at least one processor may reconstruct at least one image of the subject based on the acquired k-space data.

In a third aspect of the present disclosure, a non-transitory computer-readable medium is provided. The non-transitory computer-readable medium includes at least one set of instructions. When the at least one set of instructions are executed by at least one processor of a computer device, the at least one set of instructions directs the at least one processor to perform one or more operations as the following. The at least one processor may obtain a radial sampling scheme including a plurality of radial lines that each pass through a center of k-space. Adjacent ones of the plurality of radial lines can be spaced by a baseline angular increment. The at least one processor may select the plurality of radial lines of the radial sampling scheme. Each of the plurality of radial lines may be selected in a random and unrepeatable manner. Successive selected radial lines may be spaced by an integral multiple of the baseline angular increment. The at least one processor may acquire k-space data along the selected radial lines. The at least one processor may reconstruct at least one image of the subject based on the acquired k-space data.

Additional features will be set forth in part in the description which follows, and in part will become apparent to those skilled in the art upon examination of the following and the accompanying drawings or may be learned by production or operation of the examples. The features of the present disclosure may be realized and attained by practice or use of various aspects of the methodologies, instrumentalities, and combinations set forth in the detailed examples discussed below.

BRIEF DESCRIPTION OF THE DRAWINGS

The present disclosure is further described in terms of exemplary embodiments. These exemplary embodiments are described in detail with reference to the drawings. These embodiments are non-limiting exemplary embodiments, in which like reference numerals represent similar structures throughout the several views of the drawings, and wherein.

DETAILED DESCRIPTION

In the following detailed description, numerous specific details are set forth by way of examples in order to provide a thorough understanding of the relevant disclosure. However, it should be apparent to those skilled in the art that the present disclosure may be practiced without such details. In other instances, well-known methods, procedures, systems, components, and/or circuitry have been described at a relatively high-level, without detail, in order to avoid unnecessarily obscuring aspects of the present disclosure. Various modifications to the disclosed embodiments will be readily apparent to those skilled in the art, and the general principles defined herein may be applied to other embodiments and applications without departing from the spirit and scope of the present disclosure. Thus, the present disclosure is not limited to the embodiments shown, but to be accorded the widest scope consistent with the claims.

The terminology used herein is for the purpose of describing particular example embodiments only and is not intended to be limiting. As used herein, the singular forms "a," "an," and "the" may be intended to include the plural forms as well, unless the context clearly indicates otherwise. It will be further understood that the terms "comprise," "comprises," and/or "comprising," "include," "includes," and/or "including," when used in this specification, specify the presence of stated features, integers, steps, operations, elements, and/or components, but do not preclude the presence or addition of one or more other features, integers, steps, operations, elements, components, and/or groups thereof.

It will be understood that the term "system," "engine," "unit," "module," and/or "block" used herein are one method to distinguish different components, elements, parts, section or assembly of different level in ascending order. However, the terms may be displaced by another expression if they may achieve the same purpose.

Figure 3:
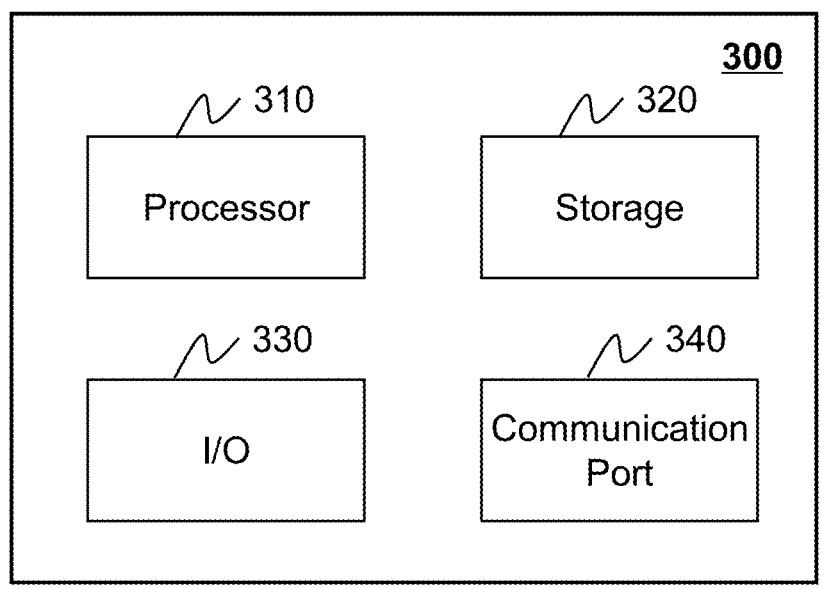
FIG. 3 is a schematic diagram illustrating exemplary hardware and/or software components of a computing device on which the processing device may be implemented according to some embodiments of the present disclosure.

Generally, the word "module," "unit," or "block," as used herein, refers to logic embodied in hardware or firmware, or to a collection of software instructions. A module, a unit, or a block described herein may be implemented as software and/or hardware and may be stored in any type of non-transitory computer-readable medium or another storage device. In some embodiments, a software module/unit/block may be compiled and linked into an executable program. It will be appreciated that software modules can be callable from other modules/units/blocks or from themselves, and/or may be invoked in response to detected events or interrupts. Software modules/units/blocks configured for execution on computing devices (e.g., processor 310 as illustrated in FIG. 3) may be provided on a computer-readable medium, such as a compact disc, a digital video disc, a flash drive, a magnetic disc, or any other tangible medium, or as a digital download (and can be originally stored in a compressed or installable format that needs installation, decompression, or decryption prior to execution). Such software code may be stored, partially or fully, on a storage device of the executing computing device, for execution by the computing device. Software instructions may be embedded in firmware, such as an Erasable Programmable Read Only Memory (EPROM). It will be further appreciated that hardware modules/units/blocks may be included in connected logic components, such as gates and flip-flops, and/or can be included of programmable units, such as programmable gate arrays or processors. The modules/units/blocks or computing device functionality described herein may be implemented as software modules/units/blocks, but may be represented in hardware or firmware. In general, the modules/units/blocks described herein refer to logical modules/units/blocks that may be combined with other modules/units/blocks or divided into sub-modules/sub-units/sub-blocks despite their physical organization or storage. The description may be applicable to a system, an engine, or a portion thereof.

It will be understood that when a unit, engine, module or block is referred to as being "on," "connected to," or "coupled to," another unit, engine, module, or block, it may be directly on, connected or coupled to, or communicate with the other unit, engine, module, or block, or an intervening unit, engine, module, or block may be present, unless the context clearly indicates otherwise. As used herein, the term "and/or" includes any and all combinations of one or more of the associated listed items.

These and other features, and characteristics of the present disclosure, as well as the methods of operation and functions of the related elements of structure and the combination of parts and economies of manufacture, may become more apparent upon consideration of the following description with reference to the accompanying drawings, all of which form a part of this disclosure. It is to be expressly understood, however, that the drawings are for the purpose of illustration and description only and are not intended to limit the scope of the present disclosure. It is understood that the drawings are not to scale.

Provided herein are systems and components for medical imaging and/or medical treatment. In some embodiments, the medical system may include an imaging system. The imaging system may include a single modality imaging system and/or a multi-modality imaging system. The single modality imaging system may include, for example, a magnetic resonance imaging (MRI) system. Exemplary MRI systems may include a superconducting magnetic resonance imaging system, a non-superconducting magnetic resonance imaging system, etc. The multi-modality imaging system may include, for example, a computed tomography-magnetic resonance imaging (MRI-CT) system, a positron emission tomography-magnetic resonance imaging (PET-MRI) system, a single photon emission computed tomography-magnetic resonance imaging (SPECT-MRI) system, a digital subtraction magnetic resonance imaging (DSA-MRI) system, etc.

Various embodiments of the present disclosure can be provided for acquiring k-space data by sampling radial k-space along substantially equidistant radial lines of a radial sampling scheme. The radial lines may include a plurality of radial lines that pass through the center of k-space. Adjacent radial lines may be spaced by a baseline angular increment. The baseline angular increment can be determined based on a desired image resolution of an image (e.g., an MR image) to be reconstructed. Compared with conventional radial sampling pattern (e.g., the golden-angle sampling scheme or the equidistant sampling scheme illustrated in FIG. 6), during the radial data acquisition, the system may acquire the k-space data in a more random and unrepeatable manner. For example, the system may select the radial lines based on an individual random probability instead that select the radial lines only in accordance with a predetermined angular increment, where can ensure uniform k-space coverage and reduce image artifacts in the reconstructed image. In some embodiments, the system can reconstruct at least one image based on the acquired k-space data. Such data acquisition scheme can be applied to two-dimensional (2D) data acquisition and/or three-dimensional (3D) data acquisition.

Figure 1:
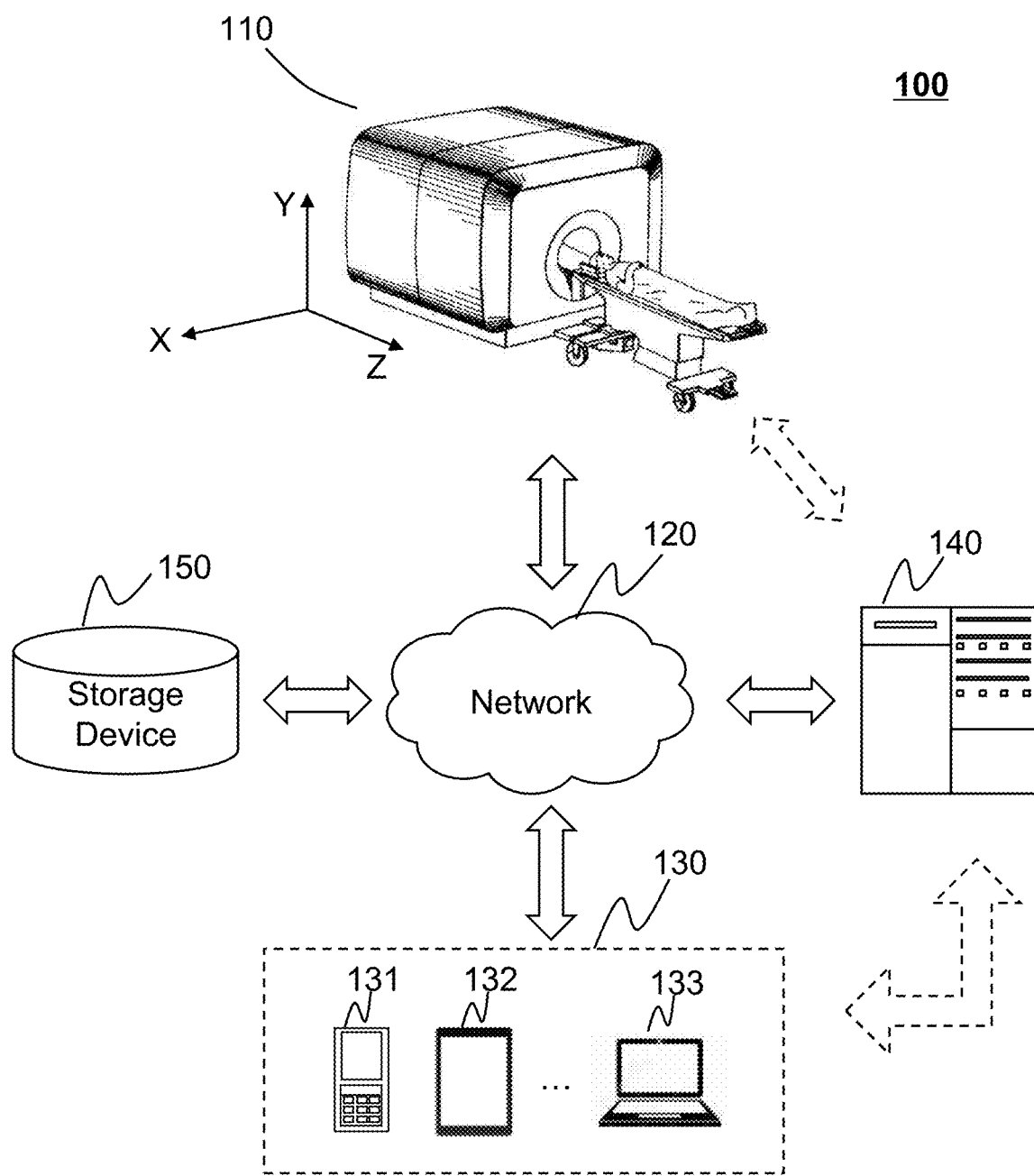
FIG. 1 is a schematic diagram illustrating an exemplary imaging system according to some embodiments of the present disclosure.

FIG. 1 is a schematic diagram illustrating an exemplary imaging system according to some embodiments of the present disclosure. As used herein, the imaging system may be an MRI system. As illustrated, the imaging system 100 may include an MRI scanner 110, a network 120, a terminal 130, a processing device 140, and a storage device 150. The components of the imaging system 100 may be connected in one or more of various ways. Mere by way of example, as illustrated in FIG. 1, the MRI scanner 110 may be connected to the processing device 140 through the network 120. As another example, the MRI scanner 110 may be connected to the processing device 140 directly (as indicated by the bi-directional arrow in dotted lines linking the MRI scanner 110 and the processing device 140). As a further example, the storage device 150 may be connected to the processing device 140 directly or through the network 120. As still a further example, a terminal device (e.g., 131, 132, 133, etc.) may be connected to the processing device 140 directly (as indicated by the bi-directional arrow in dotted lines linking the terminal 130 and the processing device 140) or through the network 120.

The MRI scanner 110 may scan an object located within its detection region and generate a plurality of data relating to the object. In the present disclosure, "subject" and "object" are used interchangeably. Mere by way of example, the object may include a patient, a man-made object, etc. As another example, the object may include a specific portion, organ, and/or tissue of a patient. For example, the object may include head, brain, neck, body, shoulder, arm, thorax, heart, stomach, blood vessel, soft tissue, knee, feet, or the like, or any combination thereof. In some embodiments, the MRI scanner 110 may be a close-bore scanner or an open-bore scanner. In the present disclosure, the X axis, the Y axis, and the Z axis shown in FIG. 1 may form an orthogonal coordinate system. The X axis and the Z axis shown in FIG. 1 may be horizontal, and the Y axis may be vertical. As illustrated, the positive X direction along the X axis may be from the right side to the left side of the MRI scanner 110 seen from the direction facing the front of the MRI scanner 110; the positive Y direction along the Y axis shown in FIG. 1 may be from the lower part to the upper part of the MRI scanner 110; the positive Z direction along the Z axis shown in FIG. 1 may refer to a direction in which the object is moved out of the scanning channel (or referred to as the bore) of the MRI scanner 110. More description of the MRI scanner 110 may be found elsewhere in the present disclosure. See, e.g., FIG. 2 and the description thereof.

The network 120 may include any suitable network that can facilitate the exchange of information and/or data for the imaging system 100. In some embodiments, one or more components of the imaging system 100 (e.g., the MRI scanner 110, the terminal 130, the processing device 140, or the storage device 150) may communicate information and/or data with one or more other components of the imaging system 100 via the network 120. For example, the processing device 140 may obtain a plurality of MR images corresponding to a sequence of time frames from the storage device 150 via the network 120. In some embodiments, the network 120 may be any type of wired or wireless network, or a combination thereof. The network 120 may be and/or include a public network (e.g., the Internet), a private network (e.g., a local area network (LAN), a wide area network (WAN)), etc.), a wired network (e.g., an Ethernet network), a wireless network (e.g., an 802.11 network, a Wi-Fi network, etc.), a cellular network (e.g., a Long Term Evolution (LTE) network), a frame relay network, a virtual private network ("VPN"), a satellite network, a telephone network, routers, hubs, switches, server computers, and/or any combination thereof. Merely by way of example, the network 120 may include a cable network, a wireline network, a fiber-optic network, a telecommunications network, an intranet, a wireless local area network (WLAN), a metropolitan area network (MAN), a public telephone switched network (PSTN), a Bluetooth™ network, a Zig-Bee™ network, a near field communication (NFC) network, or the like, or any combination thereof. In some embodiments, the network 120 may include one or more network access points. For example, the network 120 may include wired and/or wireless network access points such as base stations and/or internet exchange points through which one or more components of the imaging system 100 may be connected to the network 120 to exchange data and/or information.

The terminal 130 may include a mobile device 131, a tablet computer 132, a laptop computer 133, or the like, or any combination thereof. In some embodiments, the mobile device 131 may include a smart home device, a wearable device, a smart mobile device, a virtual reality device, an augmented reality device, or the like, or any combination thereof. In some embodiments, the smart home device may include a smart lighting device, a control device of an intelligent electrical apparatus, a smart monitoring device, a smart television, a smart video camera, an interphone, or the like, or any combination thereof. In some embodiments, the wearable device may include a smart bracelet, smart footgear, a pair of smart glasses, a smart helmet, a smart watch, smart clothing, a smart backpack, a smart accessory, or the like, or any combination thereof. In some embodiments, the smart mobile device may include a smartphone, a personal digital assistant (PDA), a gaming device, a navigation device, a point of sale (POS) device, or the like, or any combination thereof. In some embodiments, the virtual reality device and/or the augmented reality device may include a virtual reality helmet, a virtual reality glass, a virtual reality patch, an augmented reality helmet, an augmented reality glass, an augmented reality patch, or the like, or any combination thereof. For example, the virtual reality device and/or the augmented reality device may include a Google™ Glass, an Oculus Rift, a Hololens, a Gear VR, etc. In some embodiments, the terminal 130 may remotely operate the MRI scanner 110 and/or the processing device 140. In some embodiments, the terminal 130 may operate the MRI scanner 110 and/or the processing device 140 via a wireless connection. In some embodiments, the terminal 130 may receive information and/or instructions inputted by a user, and send the received information and/or instructions to the MRI scanner 110 or to the processing device 140 via the network 120. In some embodiments, the terminal 130 may receive data and/or information from the processing device 140. In some embodiments, the terminal 130 may be part of the processing device 140. In some embodiments, the terminal 130 may be omitted.

The processing device 140 may process data and/or information obtained from the MRI scanner 110, the terminal 130, and/or the storage device 150. For example, the processing device 140 may obtain a radial sampling scheme. During the data acquisition, the processing device 140 may select each radial line of the radial sampling scheme in a random and unrepeatable manner. The k-space data along the selected radial lines can be acquired. The processing device 140 may reconstruct at least one image based on the acquired k-space data based on one or more reconstruction algorithms.

In some embodiments, the processing device 140 may be a single server, or a server group. The server group may be centralized or distributed. In some embodiments, the processing device 140 may be local or remote. For example, the processing device 140 may access information and/or data stored in or acquired by the MRI scanner 110, the terminal 130, and/or the storage device 150 via the network 120. As another example, the processing device 140 may be directly connected to the MRI scanner 110 (as illustrated by the bidirectional arrow in dashed lines connecting the processing device 140 and the MRI scanner 110 in FIG. 1), the terminal 130 (as illustrated by the bidirectional arrow in dashed lines connecting the processing device 140 and the terminal 130 in FIG. 1), and/or the storage device 150 to access stored or acquired information and/or data. In some embodiments, the processing device 140 may be implemented on a cloud platform. Merely by way of example, the cloud platform may include a private cloud, a public cloud, a hybrid cloud, a community cloud, a distributed cloud, an inter-cloud, a multi-cloud, or the like, or any combination thereof. In some embodiments, the processing device 140 may be implemented on a computing device 300 having one or more components illustrated in FIG. 3 in the present disclosure.

The storage device 150 may store data and/or instructions. In some embodiments, the storage device 150 may store data obtained from the MRI scanner 110, the terminal 130 and/or the processing device 140. For example, the storage device 150 may a radial sampling scheme for k-space data acquisition. In some embodiments, the storage device 150 may store data and/or instructions that the processing device 140 may execute or use to perform exemplary methods described in the present disclosure. For example, the storage device 150 may store instructions that the processing device 140 may execute to perform one or more operations for generating an image (e.g., an MR image) of a subject based on the acquired k-space data. In some embodiments, the storage device 150 may include a mass storage device, a removable storage device, a volatile read-and-write memory, a read-only memory (ROM), or the like, or any combination thereof. Exemplary mass storage may include a magnetic disk, an optical disk, a solid-state drive, etc. Exemplary removable storage may include a flash drive, a floppy disk, an optical disk, a memory card, a zip disk, a magnetic tape, etc. Exemplary volatile read-and-write memory may include a random-access memory (RAM). Exemplary RAM may include a dynamic RAM (DRAM), a double date rate synchronous dynamic RAM (DDR SDRAM), a static RAM (SRAM), a thyristor RAM (T-RAM), and a zero-capacitor RAM (Z-RAM), etc. Exemplary ROM may include a mask ROM (MROM), a programmable ROM (PROM), an erasable programmable ROM (PEROM), an electrically erasable programmable ROM (EEPROM), a compact disk ROM (CD-ROM), and a digital versatile disk ROM, etc. In some embodiments, the storage device 150 may be implemented on a cloud platform. Merely by way of example, the cloud platform may include a private cloud, a public cloud, a hybrid cloud, a community cloud, a distributed cloud, an inter-cloud, a multi-cloud, or the like, or any combination thereof.

In some embodiments, the storage device 150 may be connected to the network 120 to communicate with one or more components of the imaging system 100 (e.g., the MRI scanner 110, the processing device 140, the terminal 130, etc.). One or more components of the imaging system 100 may access the data or instructions stored in the storage device 150 via the network 120. In some embodiments, the storage device 150 may be directly connected to or communicate with one or more components of the imaging system 100 (e.g., the MRI scanner 110, the processing device 140, the terminal 130, etc.). In some embodiments, the storage device 150 may be part of the processing device 140.

In some embodiments, the imaging system 100 may further include one or more power supplies (not shown in FIG. 1) connected to one or more components of the imaging system 100 (e.g., the MRI scanner 110, the processing device 140, the terminal 130, the storage device 150, etc.).

Figure 2:
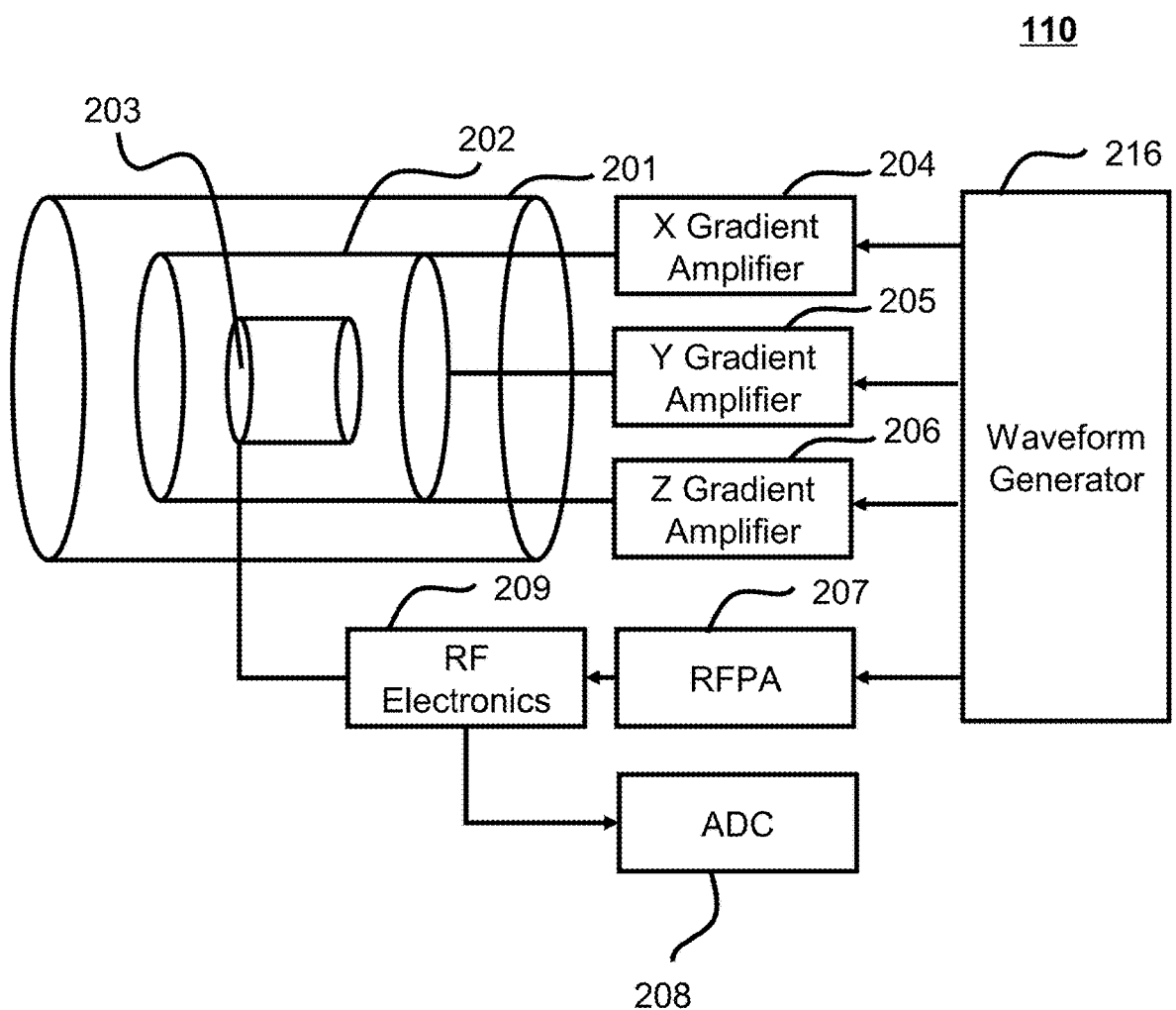
FIG. 2 is a schematic diagram illustrating an exemplary MRI scanner according to some embodiments of the present disclosure.

FIG. 2 is a schematic diagram illustrating an exemplary MRI scanner according to some embodiments of the present disclosure. One or more components of the MRI scanner 110 are illustrated in FIG. 2. As illustrated, main magnet 201 may generate a first magnetic field (or referred to as a main magnetic field) that may be applied to an object (also referred to as a subject) exposed inside the field. The main magnet 201 may include a resistive magnet or a superconductive magnet that both need a power supply (not shown) for operation. Alternatively, the main magnet 201 may include a permanent magnet. The main magnet 201 may include a bore that the object is placed within. The main magnet 201 may also control the homogeneity of the generated main magnetic field. Some shim coils may be in the main magnet 201. The shim coils placed in the gap of the main magnet 201 may compensate for the inhomogeneity of the magnetic field of the main magnet 201. The shim coils may be energized by a shim power supply.

Gradient coils 202 may be located inside the main magnet 201. The gradient coils 202 may generate a second magnetic field (or referred to as a gradient field, including gradient fields Gx, Gy, and Gz). The second magnetic field may be superimposed on the main field generated by the main magnet 201 and distort the main field so that the magnetic orientations of the protons of an object may vary as a function of their positions inside the gradient field, thereby encoding spatial information into MR signals generated by the region of the object being imaged. The gradient coils 202 may include X coils (e.g., configured to generate the gradient field Gx corresponding to the X direction), Y coils (e.g., configured to generate the gradient field Gy corresponding to the Y direction), and/or Z coils (e.g., configured to generate the gradient field Gz corresponding to the Z direction) (not shown in FIG. 2). In some embodiments, the Z coils may be designed based on circular (Maxwell) coils, while the X coils and the Y coils may be designed on the basis of the saddle (Golay) coil configuration. The three sets of coils may generate three different magnetic fields that are used for position encoding. The gradient coils 202 may allow spatial encoding of MR signals for image construction. The gradient coils 202 may be connected with one or more of an X gradient amplifier 204, a Y gradient amplifier 205, or a Z gradient amplifier 206. One or more of the three amplifiers may be connected to a waveform generator 216. The waveform generator 216 may generate gradient waveforms that are applied to the X gradient amplifier 204, the Y gradient amplifier 205, and/or the Z gradient amplifier 206. An amplifier may amplify a waveform. An amplified waveform may be applied to one of the coils in the gradient coils 202 to generate a magnetic field in the X-axis, the Y-axis, or the Z-axis, respectively. The gradient coils 202 may be designed for either a close-bore MRI scanner or an open-bore MRI scanner. In some instances, all three sets of coils of the gradient coils 202 may be energized and three gradient fields may be generated thereby. In some embodiments of the present disclosure, the X coils and Y coils may be energized to generate the gradient fields in the X direction and the Y direction. As used herein, the X-axis, the Y-axis, the Z-axis, the X direction, the Y direction, and the Z direction in the description of FIG. 2 are the same as or similar to those described in FIG. 1.

In some embodiments, radio frequency (RF) coils 203 may be located inside the main magnet 201 and serve as transmitters, receivers, or both. The RF coils 203 may be in connection with RF electronics 209 that may be configured or used as one or more integrated circuits (ICs) functioning as a waveform transmitter and/or a waveform receiver. The RF electronics 209 may be connected to a radiofrequency power amplifier (RFPA) 207 and an analog-to-digital converter (ADC) 208.

When used as transmitters, the RF coils 203 may generate RF signals that provide a third magnetic field that is utilized to generate MR signals related to the region of the object being imaged. The third magnetic field may be perpendicular to the main magnetic field. The waveform generator 216 may generate an RF pulse. The RF pulse may be amplified by the RFPA 207, processed by the RF electronics 209, and applied to the RF coils 203 to generate the RF signals in response to a powerful current generated by the RF electronics 209 based on the amplified RF pulse.

When used as receivers, the RF coils may be responsible for detecting MR signals (e.g., echoes). After excitation, the MR signals generated by the object may be sensed by the RF coils 203. The receive amplifier then may receive the sensed MR signals from the RF coils 203, amplify the sensed MR signals, and provide the amplified MR signals to the ADC 208. The ADC 208 may transform the MR signals from analog signals to digital signals. The digital MR signals may be filled to a k-space based on a predetermined k-space sampling scheme. In some embodiments, the k-space data may be sent to the processing device 140 for further reconstructing.

In some embodiments, the gradient coils 202 and the RF coils 203 may be circumferentially positioned with respect to the object. It is understood by those skilled in the art that the main magnet 201, the gradient coils 202, and the RF coils 203 may be situated in a variety of configurations around the object.

In some embodiments, the RFPA 207 may amplify an RF pulse (e.g., the power of the RF pulse, the voltage of the RF pulse) such that an amplified RF pulse is generated to drive the RF coils 203. The RFPA 207 may include a transistor-based RFPA, a vacuum tube-based RFPA, or the like, or any combination thereof. The transistor-based RFPA may include one or more transistors. The vacuum tube-based RFPA may include a triode, a tetrode, a klystron, or the like, or any combination thereof. In some embodiments, the RFPA 207 may include a linear RFPA, or a nonlinear RFPA. In some embodiments, the RFPA 207 may include one or more RFPAs.

In some embodiments, the MRI scanner 110 may further include an object positioning system (not shown). The object positioning system may include an object cradle and a transport device. The object may be placed on the object cradle and be positioned by the transport device within the bore of the main magnet 201.

FIG. 3 is a schematic diagram illustrating exemplary hardware and/or software components of a computing device on which a processing device may be implemented according to some embodiments of the present disclosure. As illustrated in FIG. 3, computing device 300 may include a processor 310, a storage 320, an input/output (I/O) 330, and a communication port 340.

The processor 310 may execute computer instructions (program code) and perform functions of the processing device 140 in accordance with techniques described herein. The computer instructions may include routines, programs, objects, components, signals, data structures, procedures, modules, and functions, which perform particular functions described herein. For example, the processor 310 may acquire k-space data by sampling k-space along the radial lines in a random and unrepeatable manner. In some embodiments, the processor 310 may include a microcontroller, a microprocessor, a reduced instruction set computer (RISC), an application specific integrated circuits (ASICs), an application-specific instruction-set processor (ASIP), a central processing unit (CPU), a graphics processing unit (GPU), a physics processing unit (PPU), a microcontroller unit, a digital signal processor (DSP), a field programmable gate array (FPGA), an advanced RISC machine (ARM), a programmable logic device (PLD), any circuit or processor capable of executing one or more functions, or the like, or any combinations thereof.

Merely for illustration purposes, only one processor is described in the computing device 300. However, it should be noted that the computing device 300 in the present disclosure may also include multiple processors, and thus operations of a method that are performed by one processor as described in the present disclosure may also be jointly or separately performed by the multiple processors. For example, if in the present disclosure the processor of the computing device 300 executes both operations A and B, it should be understood that operations A and step B may also be performed by two different processors jointly or separately in the computing device 300 (e.g., a first processor executes operation A and a second processor executes operation B, or the first and second processors jointly execute operations A and B).

The storage 320 may store data/information obtained from the MRI scanner 110, the terminal 130, the storage device 150, or any other component of the MRI system 100. In some embodiments, the storage 320 may include a mass storage device, a removable storage device, a volatile read-and-write memory, a read-only memory (ROM), or the like, or any combination thereof. For example, the mass storage device may include a magnetic disk, an optical disk, a solid-state drive, etc. The removable storage device may include a flash drive, a floppy disk, an optical disk, a memory card, a zip disk, a magnetic tape, etc. The volatile read-and-write memory may include a random-access memory (RAM). The RAM may include a dynamic RAM (DRAM), a double date rate synchronous dynamic RAM (DDR SDRAM), a static RAM (SRAM), a thyristor RAM (T-RAM), and a zero-capacitor RAM (Z-RAM), etc. The ROM may include a mask ROM (MROM), a programmable ROM (PROM), an erasable programmable ROM (PEROM), an electrically erasable programmable ROM (EEPROM), a compact disk ROM (CD-ROM), and a digital versatile disk ROM, etc. In some embodiments, the storage 320 may store one or more programs and/or instructions to perform exemplary methods described in the present disclosure.

The I/O 330 may input or output signals, data, or information. In some embodiments, the I/O 330 may enable user interaction with the processing device 140. In some embodiments, the I/O 330 may include an input device and an output device. Exemplary input devices may include a keyboard, a mouse, a touch screen, a microphone, a trackball, or the like, or a combination thereof. Exemplary output devices may include a display device, a loudspeaker, a printer, a projector, or the like, or a combination thereof. Exemplary display devices may include a liquid crystal display (LCD), a light-emitting diode (LED)-based display, a flat panel display, a curved screen, a television device, a cathode ray tube (CRT), or the like, or a combination thereof.

Merely by way of example, a user (e.g., an operator) of the processing device 140 may input data related to an object (e.g., a patient) that is being/to be imaged/scanned through the I/O 330. The data related to the object may include identification information (e.g., the name, age, gender, medical history, contract information, physical examination result, etc.) and/or the test information including the nature of the MRI scan that must be performed. The user may also input parameters needed for the operation of the MRI scanner 110, such as image contrast and/or ratio, a region of interest (ROI), slice thickness, an imaging type (e.g., T1 weighted imaging, T2 weighted imaging, proton density weighted imaging, etc.), T1, T2, an echo type (spin echo, fast spin echo (FSE), fast recovery FSE, single shot FSE, gradient recalled echo, fast imaging with steady-state procession, and so on), a flip angle value, acquisition time (TA), echo time (TE), repetition time (TR), echo train length (ETL), the number of phases, the number of excitations (NEX), inversion time, bandwidth (e.g., RF receiver bandwidth, RF transmitter bandwidth, etc.), a scan type, a type of sampling, or the like, or any combination thereof. The I/O may also display MR images generated based on the sampled data.

The communication port 340 may be connected to a network (e.g., the network 120) to facilitate data communications. The communication port 340 may establish connections between the processing device 140 and the MRI scanner 110, the terminal 130, or the storage device 150. The connection may be a wired connection, a wireless connection, or a combination of both that enables data transmission and reception. The wired connection may include an electrical cable, an optical cable, a telephone wire, or the like, or any combination thereof. The wireless connection may include Bluetooth, Wi-Fi, WiMax, WLAN, ZigBee, mobile network (e.g., 3G, 4G, 5G, 6G, etc.), or the like, or a combination thereof. In some embodiments, the communication port 340 may be a standardized communication port, such as RS232, RS485, etc. In some embodiments, the communication port 340 may be a specially designed communication port. For example, the communication port 340 may be designed in accordance with the digital imaging and communications in medicine (DICOM) protocol.

Figure 4:
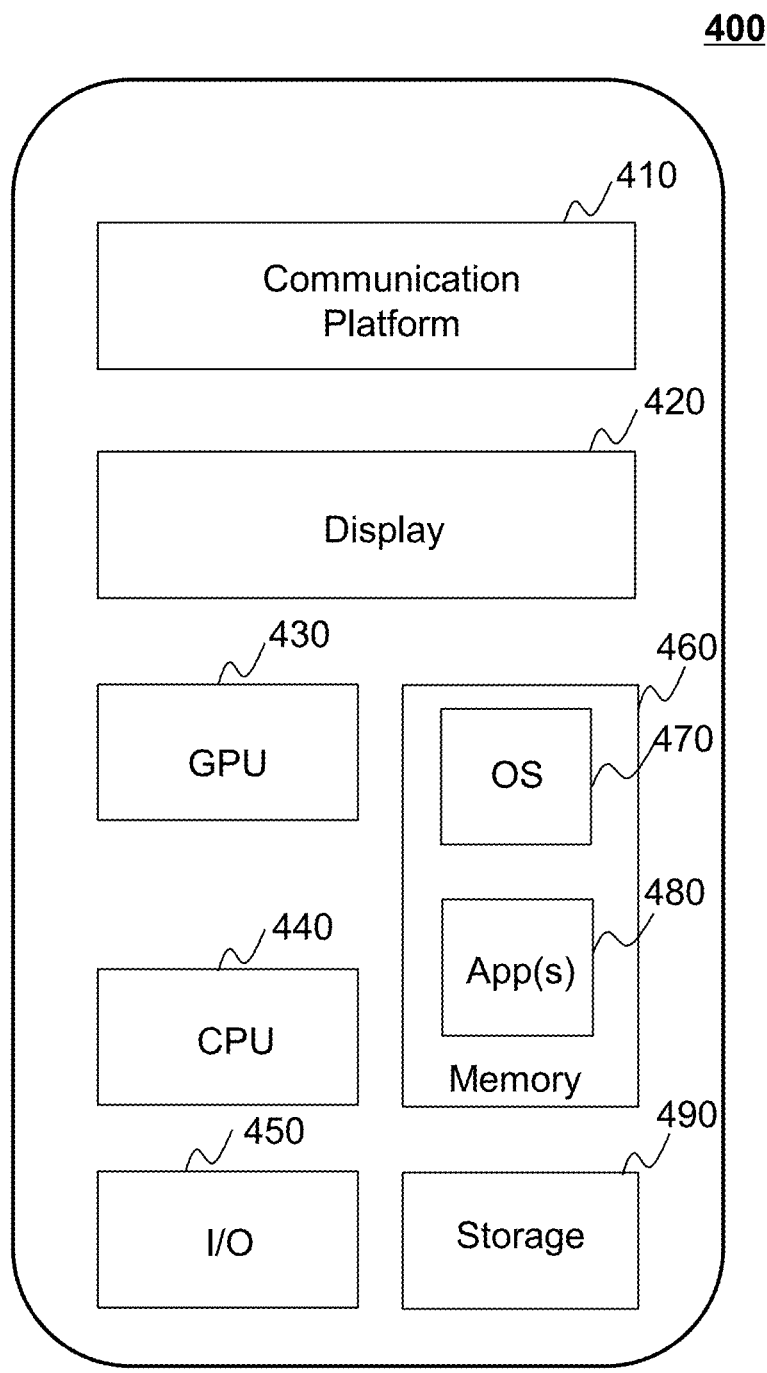
FIG. 4 is a schematic diagram illustrating exemplary hardware and/or software components of a mobile device according to some embodiments of the present disclosure.

FIG. 4 is a schematic diagram illustrating exemplary hardware and/or software components of a mobile device on which a terminal may be implemented according to some embodiments of the present disclosure. As illustrated in FIG. 4, mobile device 400 may include a communication platform 410, a display 420, a graphic processing unit (GPU) 430, a central processing unit (CPU) 440, a I/O 450, a memory 460, and a storage 490. In some embodiments, any other suitable component, including but not limited to a system bus or a controller (not shown), may also be included in the mobile device 400. In some embodiments, a mobile operating system 470 (e.g., iOS, Android, Windows Phone, HM OS, etc.) and one or more applications 480 may be loaded into the memory 460 from the storage 490 in order to be executed by the CPU 440. The applications 480 may include a browser or any other suitable mobile apps for receiving and rendering information relating to image processing or other information from the processing device 140. User interactions with the information stream may be achieved via the I/O 450 and provided to the processing device 140 and/or other components of the MRI system 100 via the network 120.

To implement various modules, units, and their functionalities described in the present disclosure, computer hardware platforms may be used as the hardware platform(s) for one or more of the elements described herein. The hardware elements, operating systems and programming languages of such computers are conventional in nature, and it is presumed that those skilled in the art are adequately familiar therewith to adapt those technologies to generate and track shapes of a target as described herein. A computer with user interface elements may be used to implement a personal computer (PC) or another type of work station or terminal device, although a computer may also act as a server if appropriately programmed. It is believed that those skilled in the art are familiar with the structure, programming and general operation of such computer equipment and as a result the drawings should be self-explanatory.

Figure 5:
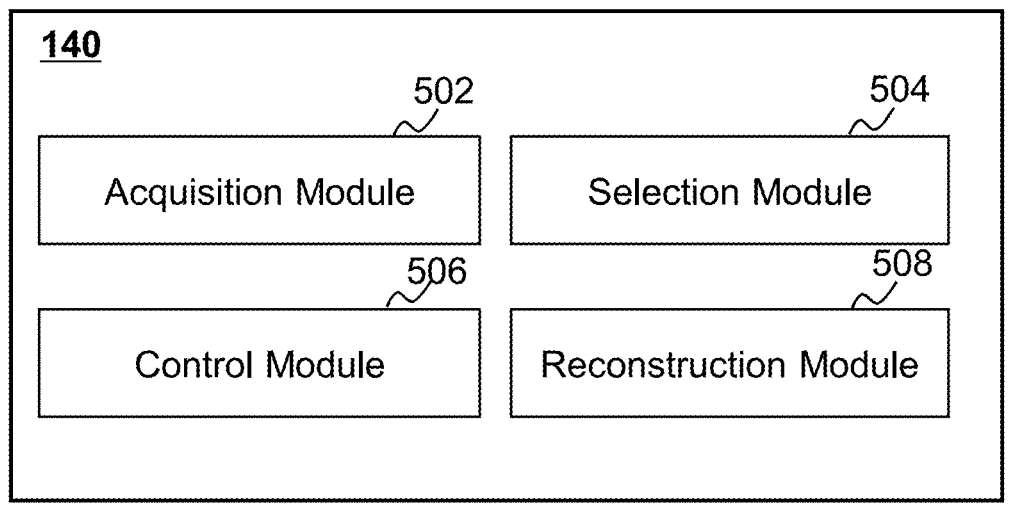
FIG. 5 is a block diagram illustrating an exemplary processing device according to some embodiments of the present disclosure.

FIG. 5 is a block diagram illustrating an exemplary processing device according to some embodiments of the present disclosure. In some embodiments, the processing device 140 may be implemented on a computing device 300 (e.g., the processor 310) illustrated in FIG. 2 or a CPU 440 illustrated in FIG. 4. As illustrated in FIG. 5, the processing device 140 may include an acquisition module 502, a selection module 504, a control module 506 and a reconstruction module 508. Each of the modules described above may be a hardware circuit that is designed to perform certain actions, e.g., according to a set of instructions stored in one or more storage media, and/or any combination of the hardware circuit and the one or more storage media.

The acquisition module 502 may be configured to obtain information related to the imaging system 100. In some embodiments, the acquisition module 502 may obtain a radial sampling scheme including a plurality of radial lines that each pass through a center of k-space. A radial line may refer to a sampling trajectory for acquiring k-space data. In some embodiments, the radial sampling scheme may include a symmetric radial sampling scheme (e.g., the proposed radial sampling scheme illustrated in FIG. 10) or an asymmetric radial sampling scheme (not shown). In the symmetric radial sampling scheme, each radial line may pass through the center of k-space and have constant radial length. In the asymmetric radial sampling scheme, each radial line may pass through the center of k-space, while part of the radial lines has the inconstant radial length. For either the symmetric radial sampling scheme or the asymmetric radial sampling scheme, the plurality of radial lines may be equally spaced in the Kx-Ky plane of the k-space. In some embodiments, the acquisition module 502 may acquire k-space data along the selected radial lines. The acquisition module 502 may acquire the k-space data in accordance with a sequence of the selected radial lines. For example, the acquisition module 502 may acquire, in turn, the k-space data corresponding to each radial line in accordance with a selection sequence of the radial lines.

The selection module 504 may be configured to select the plurality of radial lines of the radial sampling scheme. Each of the plurality of radial lines may be selected in a random and unrepeatable manner. In some embodiments, the successive selected radial lines may be spaced by an integral multiple of the baseline angular increment. Merely by way of example, the selection module 504 may randomly select a first radial line and a second radial line from the radial sampling scheme, respectively. It is a high probability that the first radial line and the second radial line are not adjacent due to the random selection way. When the successive selected first and second radial lines are not adjacent, an intersection angle between the first and second radial lines is at least double times of the baseline angular increment. In some embodiments, when a radial line has been selected, the radial line can't be selected any more during the k-space data acquisition, which may avoid to repeat acquiring k-space data and introduce the redundant data.

The control module 506 may be configured to direct an MRI device (e.g., the MRI scanner 110) to perform an MR scan based on at least one scan protocol. In some embodiments, the scan protocol may be designed for one or more regions of interest (ROIs) to be imaged. In some embodiments, the scan protocol may include a certain number of pulse sequences oriented in different planes and/or different parameters (e.g., FOV). The pulse sequences may include a spin echo sequence, a gradient echo sequence, a diffusion sequence, an inversion recovery sequence, or the like, or any combination thereof. In some embodiments, the pulse sequences (e.g., $G_x$, $G_y$, and $G_z$) may be designed in accordance with the data acquisition scheme indicative of the radial sampling scheme. During the MR scan, once a specific pulse sequence is triggered, raw MR echo signals related to the pulse sequence can be acquired accordingly. Then the raw MR echo signals may be sampled and filled to a radial line of k-space.

The reconstruction module 508 may be configured to reconstruct at least one image of the subject based on the acquired k-space data. Different reconstruction techniques may be applied to reconstruct the at least one image. Exemplary reconstruction techniques may include Fourier reconstruction, inverse Fourier reconstruction, constrained image reconstruction, regularized image reconstruction in parallel MRI, compressed-sensing (CI)-parallel imaging (PI) reconstruction, or the like, or any combination thereof. Exemplary CS-PI reconstruction techniques may include SparseSENSE, $l_1$-SPIRiT, SAKE, CS-SENSE, CS-GRAPPA, or the like, or any combination thereof.

In some embodiments, one or more modules illustrated in FIG. 5 may be implemented in at least part of the imaging system 100 as illustrated in FIG. 1. For example, the acquisition module 502, the selection module 504, the control module 506 and the reconstruction module 508 may be integrated into a console (not shown). Via the console, a user may set parameters for scanning a subject, controlling imaging processes, controlling parameters for the reconstruction of an image, viewing reconstructed images, etc. In some embodiments, the console may be implemented via the processing device 140 and/or the terminal(s) 130.

Figure 6:
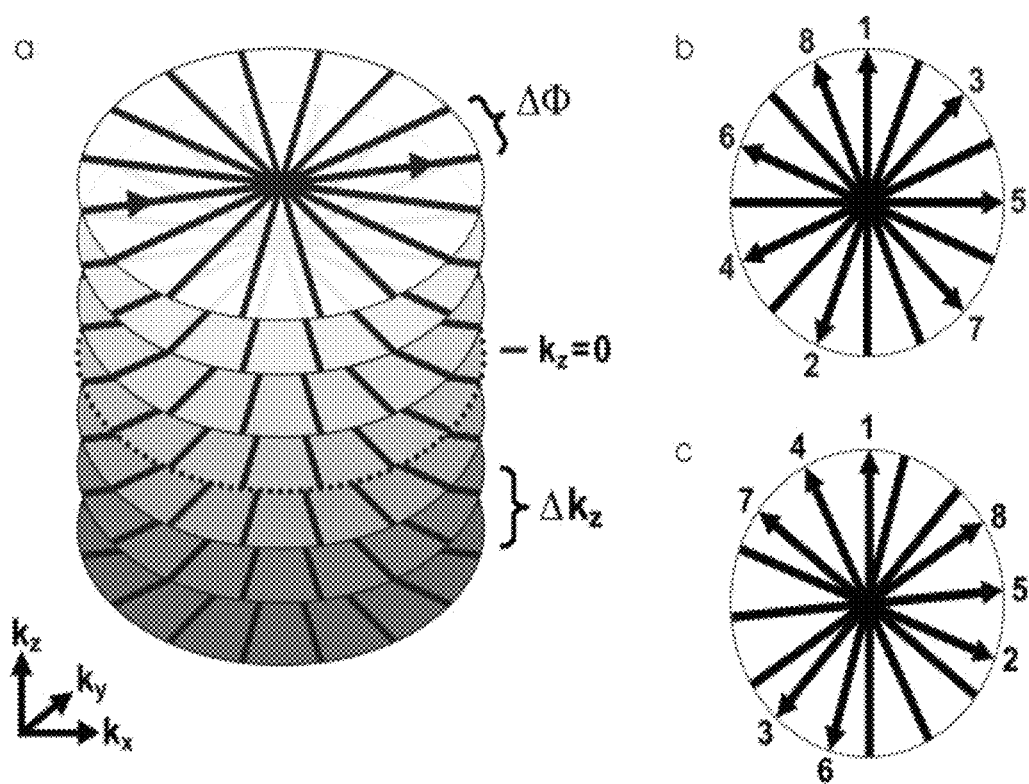
FIG. 6 is a schematic diagram illustrating an example of a three-dimensional (3D) radial sampling scheme for 3D MRI according to some embodiments of the present disclosure.

FIG. 6 illustrates an example of a three-dimensional (3D) radial sampling scheme for 3D MRI according to some embodiments of the present disclosure. The 3D MRI may be, for example, a dynamic contrast enhanced magnetic resonance imaging (DCE-MRI). Clinically, 3D radial data acquisition may be implemented using a stack-of-stars (SoS) k-space trajectory, such as SoS trajectory (a) illustrated FIG. 6, where Cartesian sampling is used along the slice selection direction and a Non-Cartesian sampling is used in the read and phase directions. In some embodiments, Kx represents a read direction (or a frequency encoding direction), Ky represents a phase encoding direction, and Kz represents a slice selection direction. The k-spaced data can be acquired in response to the gradient sequences along the three directions. In the Kx-Ky plane for each slice, the sequence may use either equidistant angular sampling with multiple interleaved radial lines or golden-angle sampling scheme. Referring to FIG. 6, the SoS trajectory (a) acquires the Kx-Ky plane along the radial lines and the Kz direction with Cartesian sampling. In some embodiments, the angles of the radial lines can be ordered using an equidistant scheme (b) or using the golden-angle scheme (c). In FIG. 6, $\Delta\emptyset$ represents an angular increment (or angular distance) between adjacent radial spokes, $\Delta K_z$ represents an interval (e.g., a slice thickness) between adjacent slices, and numbers (e.g., 1, 2, 3, . . . ) illustrated in b or c of FIG. 6 represent the temporal order of the k-space data acquisition. The k-space data may be acquired along the radial lines in accordance with the temporal order indicated by the radial spokes. The SoS k-space trajectory can be described, for example, with reference to Block et al, "Towards routine clinical use of radial stack-of-stars 3D gradient-echo sequences for reducing motion sensitivity." In some cases, the equidistant scheme (b) uses a conventional linear azimuthal angle increment, where the azimuthal angle of N successive projections is incremented by an increment angle 180°/N. In the equidistant scheme (b), the k-space data can be acquired based on the predetermined temporal order of the radial lines (e.g., represented by the numbers, 1, 2, . . . , 8). During the data acquisition, successive selected radial lines may need to be adjacent in the equidistant scheme (b), which may result in a subset of successive projections not uniformly sampling k-space due to a relatively weak randomness. In some cases, the golden-angle increment still results in significant gaps in k-space coverage due to the non-uniform radial sampling, which suffers from non-uniform coverage of k-space as a whole. To resolve the issues of non-uniform k-space coverage, it is required that the k-space sampling is more random and uniform than the conventional equidistant scheme (b) or the golden-angle scheme (c).

Figure 10:
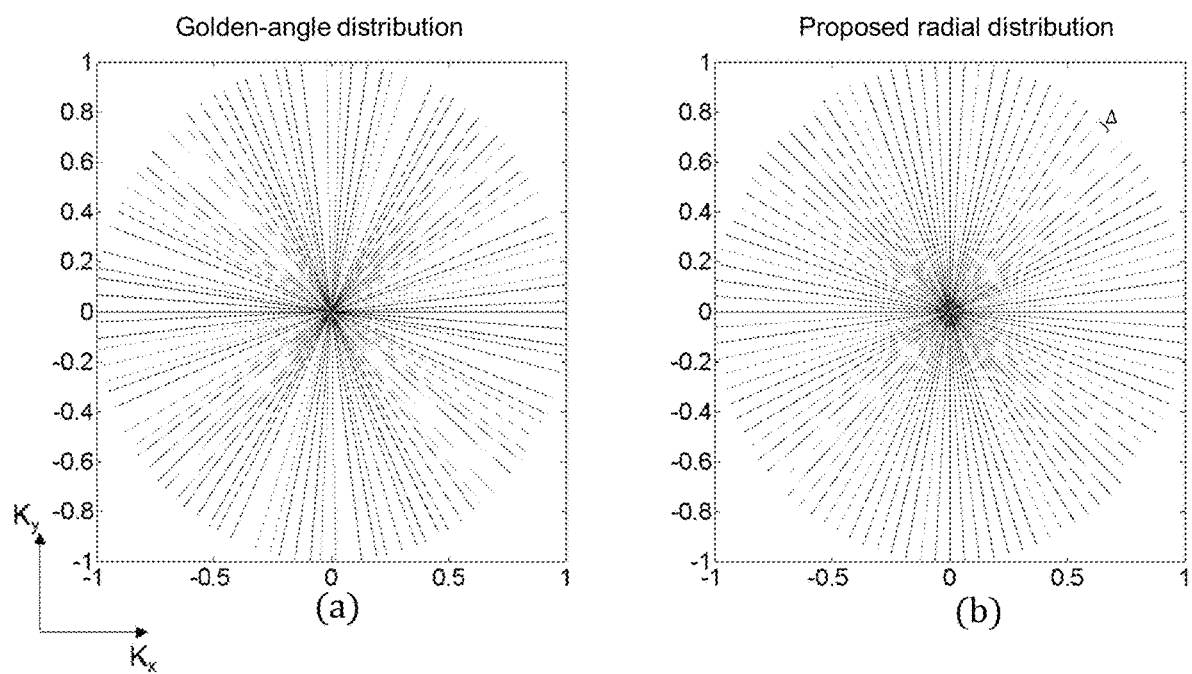
FIG. 10 is a schematic diagram illustrating a golden-angle sampling scheme and a proposed radial sampling scheme according to some embodiments of the present disclosure.

Referring to FIG. 10, (a) illustrates a golden-angle sampling scheme and (b) illustrates a proposed radial sampling scheme. In the golden-angle sampling scheme, the radial lines are designed in the golden-angle fashion. The angular distance between adjacent radial lines may be equal to 111.25°. In the proposed radial sampling scheme, the radial lines are designed in the equidistant fashion. Merely by way of example, the radial lines are symmetric relative to the center of k-space in the Kx-Ky plane. As used herein, in the Kx-Ky plane, the original (0, 0) may be designated as the center of k-space. An azimuthal angle of a radial line refers to the angle of the radial line relative to the Kx axis. As illustrated in (a) of FIG. 10, the golden-angle increment may result in significant gaps in k-space coverage and non-uniform k-space coverage due to different angular distances between adjacent radial lines. Different from the golden-angle distribution, in the proposed radial sampling scheme, the equal angular increment between adjacent radial lines may provide uniform k-space coverage. In some embodiments, the uniform k-space coverage can be achieved through selecting each radial line in a random and unrepeatable manner. Due to the property of the random and non-repetition, the successive selected radial lines may be not adjacent in probability, which is different from the equidistant scheme (b) of FIG. 8. For example, in the equidistant scheme (b) of FIG. 8, successive selected radial lines are adjacent, which results in a non-random data acquisition and has a negative impact on the uniform k-space coverage.

Figure 7:
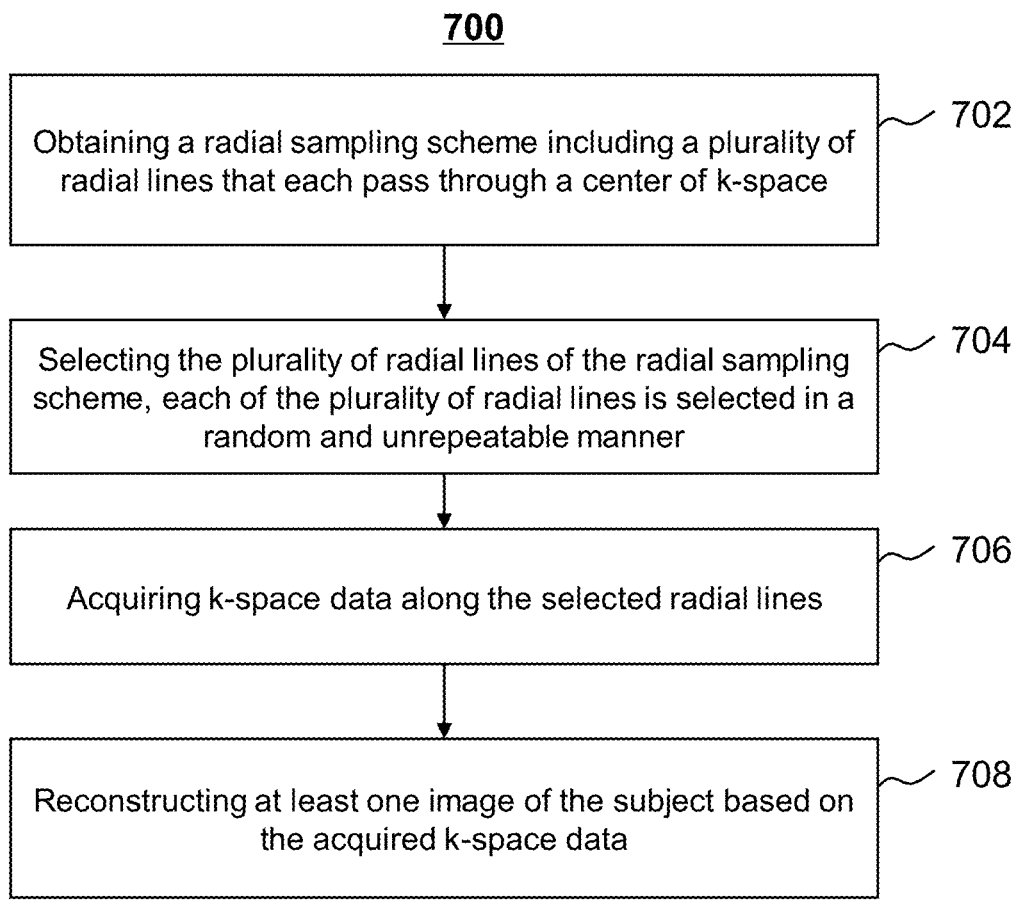
FIG. 7 is a flowchart illustrating an exemplary process for generating an image of a subject using an MRI device according to some embodiments of the present disclosure.

FIG. 7 is a flowchart illustrating an exemplary process for generating an image of a subject using a magnetic resonance imaging (MRI) device according to some embodiments of the present disclosure. In some embodiments, process 700 may be implemented in the imaging system 100 illustrated in FIG. 1. For example, the process 700 may be stored in a storage device (e.g., the storage device 150, or the storage 320 of the processing device 140) as a form of instructions, and can be invoked and/or executed by the processing device 140 (e.g., the processor 310 of the processing device 140, or one or more modules in the processing device 140 illustrated in FIG. 5). The operations of the illustrated process 700 presented below are intended to be illustrative. In some embodiments, the process 700 may be accomplished with one or more additional operations not described, and/or without one or more of the operations discussed. Additionally, the order in which the operations of the process 700 as illustrated in FIG. 7 and described below is not intended to be limiting.

In 702, the processing device (e.g., the acquisition module 502 of the processing device 140) may obtain a radial sampling scheme including a plurality of radial lines that each pass through a center of k-space. A radial line may refer to a sampling trajectory for acquiring k-space data.

In some embodiments, the radial sampling scheme may include a symmetric radial sampling scheme (e.g., the proposed radial sampling scheme illustrated in FIG. 10) or an asymmetric radial sampling scheme (not shown). In the symmetric radial sampling scheme, each radial line may pass through the center of k-space and have a constant radial length. In the asymmetric radial sampling scheme, each radial line may pass through the center of k-space, while part of the radial lines has the inconstant radial length. For either the symmetric radial sampling scheme or the asymmetric radial sampling scheme, the plurality of radial lines may be equally spaced in the Kx-Ky plane of the k-space. The adjacent radial lines may be spaced by an identical baseline angular increment (i.e., $\Delta$).

In some embodiments, the baseline angular increment may be associated with the number of the plurality of radial lines of the radial sampling scheme. In some embodiments, the number of the radial lines may be determined based on a desired image resolution. The desired image resolution refers to an image resolution of an image to be reconstructed. As used herein, the desired image resolution can be represented by m×n pixels. In some embodiments, m may be equal to n, such as 256×256 pixels. In some embodiments, m may be different from n, such as 256×512 pixels. As used herein, the image to be reconstructed may be a square image, that is, m=n. In some embodiments, the number of the plurality of radial lines (e.g., N) may be determined based on the desired image resolution. In some embodiments, for the symmetric radial sampling scheme, since the plurality of radial lines are symmetric relative to the center of k-space, N is about equal to a product of $\pi/2$ and a coefficient (e.g., m or n) of the desired image resolution. For example, given m is equal to n, $N \approx \pi/2 \times n$. In some embodiments, N may be equal to a maximum integer closing to a product of $\pi/2$ and n. In some embodiments, for the asymmetric radial sampling scheme, since the plurality of radial lines are asymmetric relative to the center of k-space, N is about equal to a product of $\pi$ and a coefficient (e.g., m or n) of the desired image resolution. For example, given m is equal to n, $N \approx \pi \times n$. In some embodiments, N may be equal to a maximum integer closing to a product of $\pi$ and n. It should be noted that the radial sampling scheme can include an arbitrary number of radial lines which facilitates to satisfy the arbitrary temporal resolution for the MRI.

In some embodiments, the baseline angular increment may be determined based on the number of radial lines of the radial sampling scheme. For example, in the asymmetric radial sampling scheme, the baseline angular increment may be determined, for example, $\Delta = 2\pi/(\pi \times n) = 2/n$. As another example, in the symmetric radial sampling scheme, the baseline angular increment may be determined, for example, $\Delta = \pi/(\pi/2 \times n) = 2/n$. As used herein, the baseline angular increment may be characterized in the form of an arc angle. It should be noted that the baseline angular increment may be set as an arbitrary angle that correlate with the number of radial lines, and not be intended to be limiting.

In 704, the processing device (e.g., the selection module 504 of the processing device 140) may select the plurality of radial lines of the radial sampling scheme. Each of the plurality of radial lines may be selected in a random and unrepeatable manner. In some embodiments, the random and unrepeatable manner indicates that the processing device can arbitrarily select a radial line but cannot select this radial line any more during the data acquisition of k-space data. In some embodiments, the radial line may be selected based on a random probability. The random probability may be derived from intersection angles formed between adjacent selected radial lines.

In some embodiments, the successive selected radial lines may be spaced by an integral multiple of the baseline angular increment. Merely by way of example, the processing device 140 may randomly select a first radial line and a second radial line from the radial sampling scheme, respectively. It is a high probability that the first radial line and the second radial line are not adjacent due to the random selection way. When the successive selected first and second radial lines are not adjacent, an intersection angle between the first and second radial lines is at least double times of the baseline angular increment. In some embodiments, when a radial line has been selected, the radial line can't be selected any more during the k-space data acquisition, which may avoid to repeat acquiring k-space data and introduce the redundant data. More descriptions regarding the random and unrepeatable selection of radial lines can be found elsewhere in the present disclosure (e.g., FIG. 8 and the descriptions thereof).

In 706, the processing device (e.g., the acquisition module 502 of the processing device 140) may acquire k-space data along the selected radial lines. In some embodiments, the processing device 140 may acquire the k-space data in accordance with a sequence of the selected radial lines. For example, the processing device 140 may acquire, in turn, the k-space data corresponding to each radial line in accordance with a selection sequence of the radial lines. In some embodiments, the k-space data may include a number of samples along each radial line. For the samples in the same radial line, they have the same azimuthal angle but have different radial lengths relative to the center of k-space. The number (or counts) of samples in each radial line may be predetermined in the radial sampling scheme. For example, in the symmetric radial sampling scheme, there are constant number (or counts) of samples in each of the radial lines. As another example, in the asymmetric radial sampling scheme, there are inconstant number of samples in at least part of the radial lines.

Merely by way of example, the processing device 140 (e.g., the control module 506 of the processing device 140) may direct the MRI device (e.g., MRI scanner 110) to scan a subject (e.g., a patient or a man-made object) based on at least one scan protocol. The scan protocol may be designed for one or more regions of interest (ROIs) to be imaged. In some embodiments, the scan protocol may include a certain number of pulse sequences oriented in different planes and/or different parameters (e.g., FOV). The pulse sequences may include a spin echo sequence, a gradient echo sequence, a diffusion sequence, an inversion recovery sequence, or the like, or any combination thereof. For example, exemplary spin echo sequences may include fast spin echo (FSE), half-Fourier acquisition single-shot turbo spin-echo (HASTE), turbo gradient spin echo (TGSE), or the like, or any combination thereof. In some embodiments, the pulse sequences (e.g., $G_x$, $G_y$ and $G_z$) may be designed in accordance with the data acquisition scheme indicative of the radial sampling scheme. During the MR scan, once a specific pulse sequence is triggered, raw MR echo signals related to the pulse sequence can be acquired accordingly. Then the raw MR echo signals may be sampled and filled to a radial line of k-space. The MR echo signals related to the pulse sequences may be filled to the radial lines of k-space in accordance with the selection sequence of the radial lines. In some embodiments, the k-space data may be used to reconstruct an MR image. It should be noted that the data acquisition strategy described here is compatible with two-dimensional and/or three-dimensional radial acquisitions (e.g., the SoS radial acquisition illustrated in FIG. 6).

In 708, the processing device (e.g., the reconstruction module 508 of the processing device 140) may reconstruct at least one image of the subject based on the acquired k-space data.

In some embodiments, the processing device 140 may perform one or more reconstruction algorithms to generate 2D images or 3D images based on the k-space data. Exemplary reconstruction algorithms may include Fourier reconstruction, inverse Fourier reconstruction, constrained image reconstruction, regularized image reconstruction in parallel MRI, compressed-sensing (CS)-parallel imaging (PI) reconstruction, or the like, or any combination thereof. Exemplary CS-PI reconstruction algorithms may include SparseSENSE, $l_1$-SPIRiT, SAKE, CS-SENSE, CS-GRAPPA, or the like, or any combination thereof. In some embodiments, the processing device 140 may reconstruct 2D slice images based on 2D radial k-space data. In some embodiments, the processing device 140 may reconstruct 3D images based on 3D k-space data composed of 2D radial k-space data.

It should be noted that the above description is merely provided for the purposes of illustration, and not intended to limit the scope of the present disclosure. For persons having ordinary skills in the art, multiple variations and modifications may be made under the teachings of the present disclosure. However, those variations and modifications do not depart from the scope of the present disclosure. For example, operations 704 and 706 may be integrated into a single operation.

Figure 8:
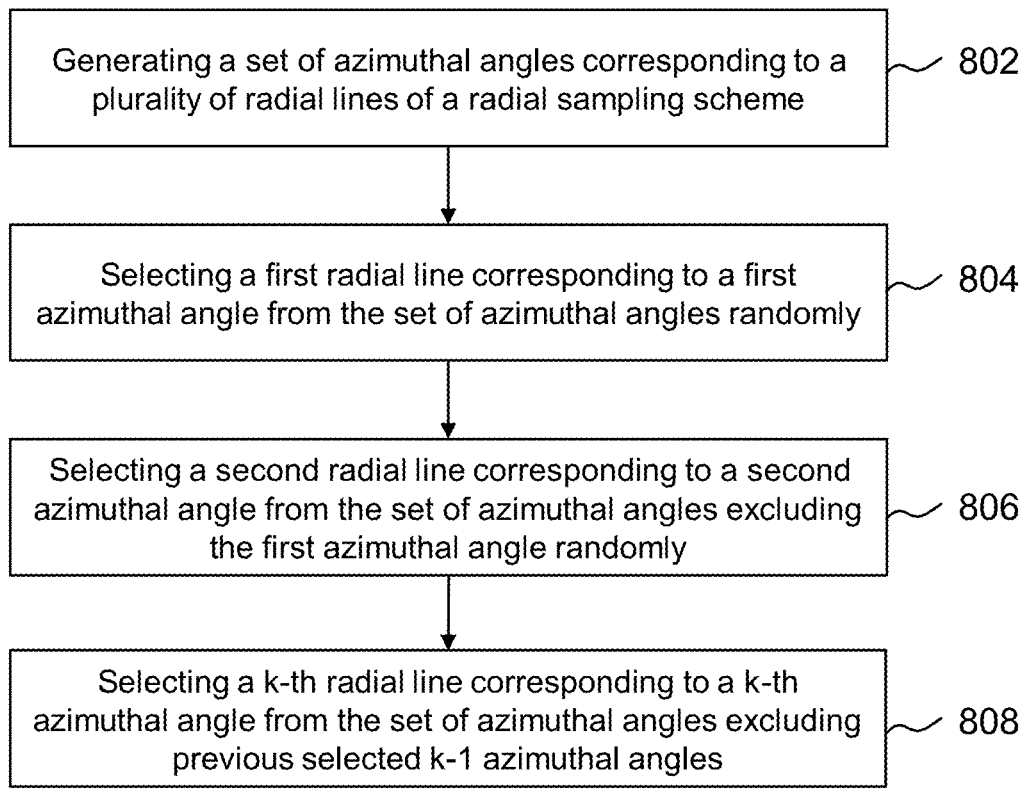
FIG. 8 is a flowchart illustrating an exemplary process for a random and unrepeatable radial line selection according to some embodiments of the present disclosure.

FIG. 8 is a flowchart illustrating an exemplary process for the random and unrepeatable radial line selection according to some embodiments of the present disclosure. In some embodiments, process 800 may be implemented in the imaging system 100 illustrated in FIG. 1. For example, the process 800 may be stored in a storage device (e.g., the storage device 150, or the storage 320 of the processing device 140) as a form of instructions, and can be invoked and/or executed by the processing device 140 (e.g., the processor 310 of the processing device 140, or one or more modules in the processing device 140 illustrated in FIG. 5). The operations of the illustrated process 800 presented below are intended to be illustrative. In some embodiments, the process 800 may be accomplished with one or more additional operations not described, and/or without one or more of the operations discussed. Additionally, the order in which the operations of the process 800 as illustrated in FIG. 8 and described below is not intended to be limiting.

In 802, the processing device (e.g., the selection module 504 of the processing device 140) may generate a set of azimuthal angles corresponding to a plurality of radial lines of a radial sampling scheme (e.g., the proposed radial sampling scheme (b) illustrated in FIG. 10). In the radial sampling scheme, adjacent ones of the plurality of radial lines are spaced by an identical baseline angular increment (e.g., Δ). The set of azimuthal angles may be indicative of the spatial information of each radial line of the k-space sampling trajectory.

The set of azimuthal angles can be represented by B, B={θ|θ=iΔ, 0≤i<N, i∈ℤ}, where θ denotes an azimuthal angle corresponding to a radial line, i denotes an increment index of a radial line, N denotes the number of radial lines of the radial sampling scheme, ℤ denotes an integer set, namely, i=0, 1, 2, . . . , N−1. As used herein, the center of k-space may be designated as an original of the Kx-Ky plane, such as the coordinates (0, 0) in Kx-Ky plane illustrated in FIG. 10. The azimuthal angle θ is the angle of the radial line relative to the Kx axis. Merely for illustration, when θ=0, the corresponding radial line is overlapped with the Kx axis. As another example, when θ=Δ, an angular distance between the relevant radial line and the Kx axis is equal to Δ. In some embodiments, the set of azimuthal angles may be stored in the form of a data structure, such as a look-up table. The processing device 140 may obtain a radial line corresponding to an azimuthal angle by retrieving the set of azimuthal angles.

In 804, the processing device (e.g., the selection module 504 of the processing device 140) may select a first radial line corresponding to a first azimuthal angle from the set of azimuthal angles randomly.

For example, the processing device 140 may randomly select an azimuthal angle from the set of azimuthal angles. The selected azimuthal angle may be designated as the first azimuthal angle. The processing device 140 may obtain the first radial line corresponding to the first azimuthal angle. In some embodiments, during the MR scan, the MR echo signals along the first radial line may be sampled and filled to the k-space at which the first radial line is.

In 806, the processor device (e.g., the selection module 504 of the processing device 140) may select a second radial line corresponding to a second azimuthal angle from the set of azimuthal angles excluding the first azimuthal angle randomly.

In some embodiments, when a specific radial line or a specific azimuthal angle of the radial line has been selected, it is not be selected any more in sequent k-space data acquisition. For example, the selected first azimuthal angle may be excluded from the set of azimuthal angles. The processing device 140 may update the set of azimuthal angles. The processing device 140 may randomly select an azimuthal angle from the updated set of azimuthal angles. The selected azimuthal angle may be designated as the second azimuthal angle. The processing device 140 may select the second radial line corresponding to the second azimuthal angle. In some embodiments, during the MR scan, the MR echo signals along the second radial line may be sampled and filled to the k-space at which the second radial line is.

In 808, the processing device (e.g., the selection module 504 of the processing device 140) may select a k-th radial line corresponding to a k-th azimuthal angle from the set of azimuthal angles excluding previous selected k−1 azimuthal angles. In some embodiments, 3≤k≤N, where k is an integer and N is the number of the radial lines of the radial sampling scheme.

Given k−1 azimuthal angles and corresponding k−1 radial lines have been selected, the previous selected k−1 azimuthal angels may be excluded from the set of azimuthal angles. The set of azimuthal angels may be updated accordingly. The processing device 140 may select, based on at least one random probability derived from intersection angles formed between adjacent ones of previous selected k−1 radial lines, the k-th azimuthal angle from the current updated set of azimuthal angles. In some embodiments, a sum of the intersection angles may be equal to π. The processing device 140 may select the k-th radial line corresponding to the k-th azimuthal angle. In some embodiments, during the MR scan, the MR echo signals along the k-th radial line may be sampled and filled to the k-space at which the k-th radial line is.

In some embodiments, the processing device 140 may determine a random probability corresponding to each of the intersection angles formed between adjacent ones of the previous selected k−1 radial lines. As used herein, the intersection angles can be represented by $\delta_1, \delta_2, \ldots, \delta_{k-1}$ respectively. The processing device 140 may determine the random probability that the k-th radial line falls in the angular range of each intersection angle. The random probability, $P_j$, may be determined based on Equation (1) as follows: For example, $$P_j \in \left\{ \frac{|\delta_1|}{|\delta_1| + |\delta_2| + \ldots + |\delta_{k-1}|}, \frac{|\delta_2|}{|\delta_1| + |\delta_2| + \ldots + |\delta_{k-1}|}, \ldots, \frac{|\delta_{k-1}|}{|\delta_1| + |\delta_2| + \ldots + |\delta_{k-1}|} \right\}.$$

In some embodiments, the processing device 140 may generate a random value. The random value can be represented by r. The random value may be generated in the range of 0 to 1, that is, $r \in (0,1)$. In some embodiments, the processing device 140 may determine a reference azimuthal angle based on the random value and an intersection angle corresponding to a maximum random probability.

In some embodiments, the maximum random probability may be determined, for example, $P_{max} = \max(P_j)$. The intersection angle corresponding to the maximum random probability (e.g., $\delta_{max}$) may be determined accordingly. The processing device 140 may determine two radial lines adjacent to the intersection angle $\delta_{max}$. The processing device 140 may obtain the maximum azimuthal angel (e.g., $\theta_{max}$) by comparing the azimuthal angles of the determined two radial lines. The processing device 140 may determine the reference azimuthal angle (e.g., $\theta_{ref}$) based on Equation (2) as follows:

$$\theta_{ref} = \pi \times r + \theta_{max} \qquad (2).$$

In some embodiments, the probability that the reference azimuthal angle falls in each intersection angle range conforms the random probability distribution derived from Equation (1). In some embodiments, the processing device 140 may retrieve the set of azimuthal angles excluding previous selected k−1 azimuthal angles, and obtain an azimuthal angle closest to the reference azimuthal angle. The azimuthal angle closest to the reference azimuthal angle may be designated as the k-th azimuthal angle. The k-th radial line corresponding to the k-th azimuthal angle may be selected accordingly.

Figure 9A:
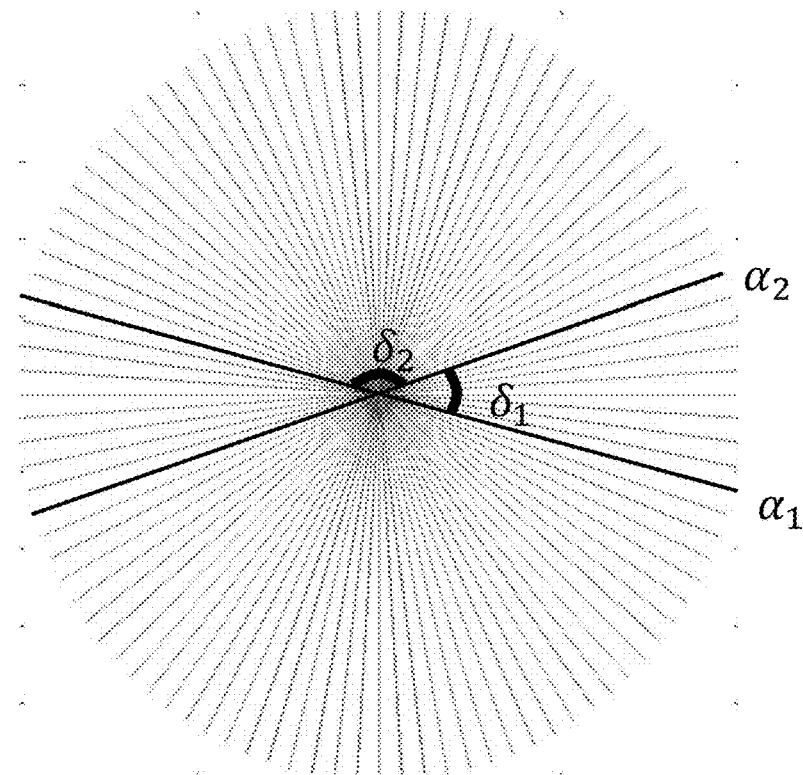
FIGS. 9A-9C illustrate an example of a random and unrepeatable radial line selection according to some embodiments of the present disclosure.
Figure 9B:
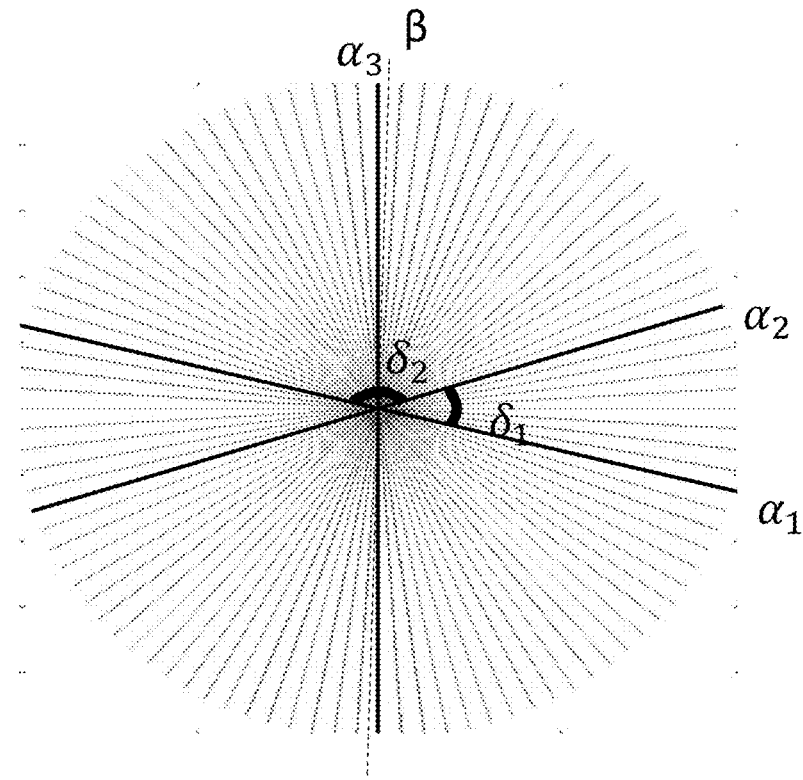
Figure 9C:
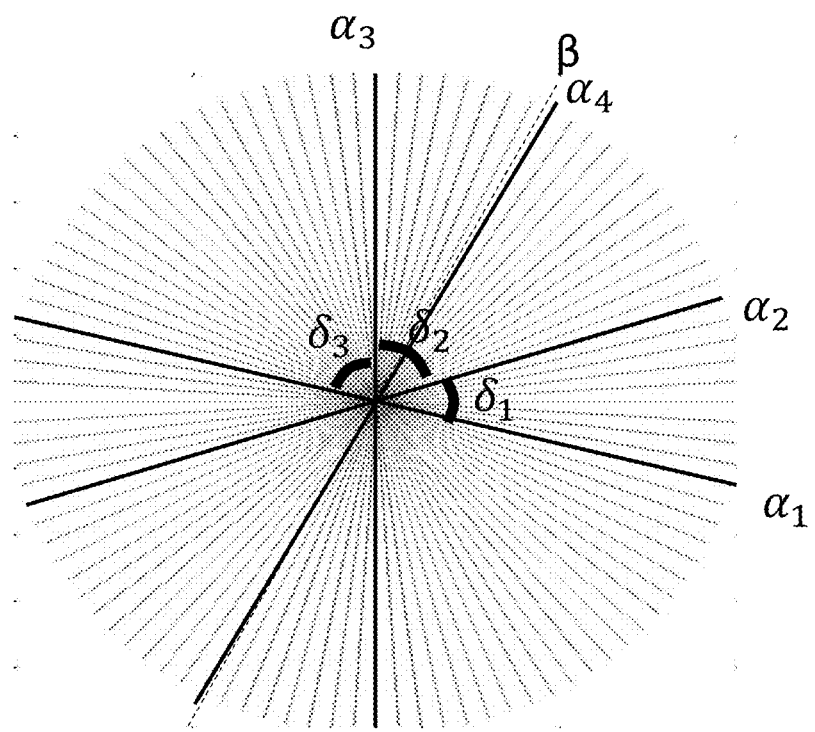

FIGS. 9A-9C illustrate an example of the random and unrepeatable radial line selection according to some embodiments of the present disclosure. Merely by way of example, a symmetric radial sampling scheme (e.g., the proposed radial sampling scheme illustrated in FIG. 10) is adopted. The radial sampling scheme may include a plurality of radial lines that each pass through the center of k-space. Adjacent ones of the plurality of radial lines can be spaced by the baseline angular increment. Merely for illustration, referring to FIG. 9A, during the k-space data acquisition, a first radial line $\alpha_1$ and a second radial line $\alpha_2$ can be selected randomly. The intersection angles formed between the first radial line and the second radial line may be determined, such as $\delta_1$ and $\delta_2$. Referring to FIG. 9B, a third radial line $\alpha_3$ may be selected based on a reference line β. The azimuthal angle of the reference line may be determined based on random probabilities derived from the intersection angles $\delta_1$ and $\delta_2$. In some embodiments, a first random probability corresponding to the intersection angle $\delta_1$ and a second random probability corresponding to the intersection angle $\delta_2$ may be determined based on Equation (1), respectively. By comparing the first random probability and the second random probability, the processing device 140 may determine the maximum azimuthal angle of the previous selected first and second radial lines. For example, the azimuthal angle of the first radial line is the maximum. The azimuthal angle of the first radial line can be represented by $\theta_1$. In some embodiments, a first random value (i.e., $r_1$) may be generated through a random generator. The azimuthal angle of the reference line may be determined based on Equation (2), that is, $\theta_{ref} = \pi \times r_1 + \theta_1$. In some embodiments, an azimuthal angle that is closest to the reference azimuthal angle may be determined. The third radial line corresponding to the determined azimuthal angle may be selected accordingly. For example, as illustrated in FIG. 9B, the third radial line $\alpha_3$ can be selected.

As illustrated in FIG. 9C, a fourth radial line $\alpha_4$ can be selected via the random way similar to the selection of the third radial line $\alpha_3$. For example, the intersection angles formed between adjacent ones of the previous selected radial lines (e.g., $\alpha_1$, $\alpha_2$ and $\alpha_3$) may be obtained. As illustrated in FIG. 9C, $\delta_1$ represents the intersection angle between the first radial line and the second radial line. $\delta_2$ represents the intersection angle between the second radial line and the third radial line, and $\delta_3$ represents the intersection angle between the third radial line and the first radial line. By comparing the random probabilities associated with the intersection angles, it is found that the random probability corresponding to $\delta_2$ is the maximum. The azimuthal angle of the third radial line associated with $\delta_2$ is the maximum. The azimuthal angel of the reference line can be determined based on Equation (2), that is, $\theta_{ref} = \pi \times r_2 + \theta_3$, where $r_2$ represents a second random value and $\theta_3$ represents the azimuthal angel of the third radial line. Similarly, the remaining radial lines of the radial sampling scheme can be selected in the random and unrepeatable manner as mentioned above.

Having thus described the basic concepts, it may be rather apparent to those skilled in the art after reading this detailed disclosure that the foregoing detailed disclosure is intended to be presented by way of example only and is not limiting. Various alterations, improvements, and modifications may occur and are intended to those skilled in the art, though not expressly stated herein. These alterations, improvements, and modifications are intended to be suggested by this disclosure, and are within the spirit and scope of the exemplary embodiments of this disclosure.

Moreover, certain terminology has been used to describe embodiments of the present disclosure. For example, the terms "one embodiment," "an embodiment," and/or "some embodiments" mean that a particular feature, structure or characteristic described in connection with the embodiment is included in at least one embodiment of the present disclosure. Therefore, it is emphasized and should be appreciated that two or more references to "an embodiment" or "one embodiment" or "an alternative embodiment" in various portions of this specification are not necessarily all referring to the same embodiment. Furthermore, the particular features, structures or characteristics may be combined as suitable in one or more embodiments of the present disclosure.

Further, it will be appreciated by one skilled in the art, aspects of the present disclosure may be illustrated and described herein in any of a number of patentable classes or context including any new and useful process, machine, manufacture, or composition of matter, or any new and useful improvement thereof. Accordingly, aspects of the present disclosure may be implemented entirely hardware, entirely software (including firmware, resident software, micro-code, etc.) or combining software and hardware implementation that may all generally be referred to herein as a "unit," "module," or "system." Furthermore, aspects of the present disclosure may take the form of a computer program product embodied in one or more computer-readable media having computer readable program code embodied thereon.

A computer readable signal medium may include a propagated data signal with computer readable program code embodied therein, for example, in baseband or as part of a carrier wave. Such a propagated signal may take any of a variety of forms, including electromagnetic, optical, or the like, or any suitable combination thereof. A computer readable signal medium may be any computer readable medium that is not a computer readable storage medium and that may communicate, propagate, or transport a program for use by or in connection with an instruction execution system, apparatus, or device. Program code embodied on a computer readable signal medium may be transmitted using any appropriate medium, including wireless, wireline, optical fiber cable, RF, or the like, or any suitable combination of the foregoing.

Computer program code for carrying out operations for aspects of the present disclosure may be written in any combination of one or more programming languages, including an object-oriented programming language such as Java, Scala, Smalltalk, Eiffel, JADE, Emerald, C++, C#, VB. NET, Python or the like, conventional procedural programming languages, such as the "C" programming language, Visual Basic, Fortran 2103, Perl, COBOL 2102, PHP, ABAP, dynamic programming languages such as Python, Ruby, and Groovy, or other programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider) or in a cloud computing environment or offered as a service such as a Software as a Service (SaaS).

Furthermore, the recited order of processing elements or sequences, or the use of numbers, letters, or other designations, therefore, is not intended to limit the claimed processes and methods to any order except as may be specified in the claims. Although the above disclosure discusses through various examples what is currently considered to be a variety of useful embodiments of the disclosure, it is to be understood that such detail is solely for that purpose, and that the appended claims are not limited to the disclosed embodiments, but, on the contrary, are intended to cover modifications and equivalent arrangements that are within the spirit and scope of the disclosed embodiments. For example, although the implementation of various components described above may be embodied in a hardware device, it may also be implemented as a software-only solution, for example, an installation on an existing server or mobile device.

Similarly, it should be appreciated that in the foregoing description of embodiments of the present disclosure, various features are sometimes grouped together in a single embodiment, figure, or description thereof for the purpose of streamlining the disclosure aiding in the understanding of one or more of the various inventive embodiments. This method of disclosure, however, is not to be interpreted as reflecting an intention that the claimed subject matter requires more features than are expressly recited in each claim. Rather, inventive embodiments lie in less than all features of a single foregoing disclosed embodiment.

In some embodiments, the numbers expressing quantities or properties used to describe and claim certain embodiments of the application are to be understood as being modified in some instances by the term "about," "approximate," or "substantially." For example, "about," "approximate," or "substantially" may indicate ±20% variation of the value it describes, unless otherwise stated. Accordingly, in some embodiments, the numerical parameters set forth in the written description and attached claims are approximations that may vary depending upon the desired properties sought to be obtained by a particular embodiment. In some embodiments, the numerical parameters should be construed in light of the number of reported significant digits and by applying ordinary rounding techniques. Notwithstanding that the numerical ranges and parameters setting forth the broad scope of some embodiments of the application are approximations, the numerical values set forth in the specific examples are reported as precisely as practicable.

Each of the patents, patent applications, publications of patent applications, and other material, such as articles, books, specifications, publications, documents, things, and/or the like, referenced herein is hereby incorporated herein by this reference in its entirety for all purposes, excepting any prosecution file history associated with same, any of same that is inconsistent with or in conflict with the present document, or any of same that may have a limiting affect as to the broadest scope of the claims now or later associated with the present document. By way of example, should there be any inconsistency or conflict between the description, definition, and/or the use of a term associated with any of the incorporated material and that associated with the present document, the description, definition, and/or the use of the term in the present document shall prevail.

In closing, it is to be understood that the embodiments of the application disclosed herein are illustrative of the principles of the embodiments of the application. Other modifications that may be employed may be within the scope of the application. Thus, by way of example, but not of limitation, alternative configurations of the embodiments of the application may be utilized in accordance with the teachings herein. Accordingly, embodiments of the present application are not limited to that precisely as shown and described.

What is claimed is:

1. A system for generating an image of a subject using a magnetic resonance imaging (MRI) device, comprising:
    at least one storage device including a set of instructions; and
    at least one processor configured to communicate with the at least one storage device, wherein when executing the set of instructions, the at least one processor is configured to direct the system to perform operations including:
        obtaining a radial sampling scheme including a plurality of radial lines that each pass through a center of k-space, adjacent ones of the plurality of radial lines are spaced by a baseline angular increment;
        selecting the plurality of radial lines of the radial sampling scheme, each of the plurality of radial lines is selected in a random and unrepeatable manner, wherein successive selected radial lines are spaced by an integral multiple of the baseline angular increment;
        acquiring k-space data along the selected radial lines; and
        reconstructing at least one image of the subject based on the acquired k-space data.

2. The system of claim 1, wherein the selecting the plurality of radial lines of the radial sampling scheme includes:
    generating a set of azimuthal angles corresponding to the plurality of radial lines of the radial sampling scheme;
    selecting a first radial line corresponding to a first azimuthal angle from the set of azimuthal angles randomly;
    selecting a second radial line corresponding to a second azimuthal angle from the set of azimuthal angles excluding the first azimuthal angle randomly;
    selecting a k-th radial line corresponding to a k-th azimuthal angle from the set of azimuthal angles excluding previous selected k−1 azimuthal angles,
    wherein the k-th azimuthal angle is determined based on at least one random probability derived from intersection angles formed between adjacent ones of previous selected k−1 radial lines; and
    wherein $3 \leq k \leq N$, k being an integer and N being indicative of the number of the plurality of radial lines of the radial sampling scheme.

3. The system of claim 2, wherein a sum of the intersection angles is equal to $\pi$.

4. The system of claim 2, wherein the selecting a k-th radial line corresponding to a k-th azimuthal angle from the set of azimuthal angles excluding previous selected k−1 azimuthal angles includes:
    determining a random probability corresponding to each of the intersection angles formed between adjacent ones of the previous selected k−1 radial lines;
    generating a random value;
    determining a reference azimuthal angle based on the random value and an intersection angle corresponding to a maximum random probability;
    determining, based on the reference azimuthal angle, the k-th azimuthal angle from the set of azimuthal angles excluding previous selected k−1 azimuthal angles; and
    selecting the k-th radial line corresponding to the k-th azimuthal angle.

5. The system of claim 4, wherein the random value is in a range of 0 to 1.

6. The system of claim 2, wherein the number of the plurality of radial lines of the radial sampling scheme, N, is determined based on a desired image resolution.

7. The system of claim 6, wherein N is equal to a maximum integer closing to a product of $\pi$ and a coefficient of the desired image resolution.

8. The system of claim 6, wherein N is equal to a maximum integer closing to a product of $\pi/2$ and a coefficient of the desired image resolution.

9. The system of claim 6, wherein the baseline angular increment is determined based on the number of the plurality of radial lines of the radial sampling scheme.

10. The system of claim 1, wherein the acquiring k-space data along the selected radial lines includes:
acquiring the k-space data in accordance with a sequence of the selected radial lines.

11. A method for generating an image of a subject using a magnetic resonance imaging (MRI) device, implemented on a computing device having at least one processor and at least one storage device, comprising:
obtaining a radial sampling scheme including a plurality of radial lines that each pass through a center of k-space, adjacent ones of the plurality of radial lines are spaced by a baseline angular increment;
selecting the plurality of radial lines of the radial sampling scheme, each of the plurality of radial lines is selected in a random and unrepeatable manner, wherein successive selected radial lines are spaced by an integral multiple of the baseline angular increment;
acquiring k-space data along the selected radial lines; and
reconstructing at least one image of the subject based on the acquired k-space data.

12. The method of claim 11, wherein the selecting the plurality of radial lines of the radial sampling scheme includes:
generating a set of azimuthal angles corresponding to the plurality of radial lines of the radial sampling scheme;
selecting a first radial line corresponding to a first azimuthal angle from the set of azimuthal angles randomly;
selecting a second radial line corresponding to a second azimuthal angle from the set of azimuthal angles excluding the first azimuthal angle randomly;
selecting a k-th radial line corresponding to a k-th azimuthal angle from the set of azimuthal angles excluding previous selected k−1 azimuthal angles,
wherein the k-th azimuthal angle is determined based on at least one random probability derived from intersection angles formed between adjacent ones of previous selected k−1 radial lines; and
wherein 3≤k≤N, k being an integer and N being indicative of the number of the plurality of radial lines of the radial sampling scheme.

13. The method of claim 12, wherein a sum of the intersection angles is equal to $\pi$.

14. The method of claim 12, wherein the selecting a k-th radial line corresponding to a k-th azimuthal angle from the set of azimuthal angles excluding previous selected k−1 azimuthal angles includes:
determining a random probability corresponding to each of the intersection angles formed between adjacent ones of the previous selected k−1 radial lines;
generating a random value;
determining a reference azimuthal angle based on the random value and an intersection angle corresponding to a maximum random probability;
determining, based on the reference azimuthal angle, the k-th azimuthal angle from the set of azimuthal angles excluding previous selected k−1 azimuthal angles; and
selecting the k-th radial line corresponding to the k-th azimuthal angle.

15. The method of claim 14, wherein the random value is in a range of 0 to 1.

16. The method of claim 12, wherein the number of the plurality of radial lines of the radial sampling scheme, N, is determined based on a desired image resolution.

17. The method of claim 16, wherein N is equal to a maximum integer closing to a product of $\pi$ and a coefficient of the desired image resolution.

18. The method of claim 16, wherein N is equal to a maximum integer closing to a product of $\pi/2$ and a coefficient of the desired image resolution.

19. The method of claim 11, wherein the acquiring k-space data along the selected radial lines includes:
acquiring the k-space data in accordance with a sequence of the selected radial lines.

20. A non-transitory computer-readable medium, comprising at least one set of instructions, wherein when executed by at least one processor of a computer device, the at least one set of instructions directs the at least one processor to perform operations including:
obtaining a radial sampling scheme including a plurality of radial lines that each pass through a center of k-space, adjacent ones of the plurality of radial lines are spaced by a baseline angular increment;
selecting the plurality of radial lines of the radial sampling scheme, each of the plurality of radial lines is selected in a random and unrepeatable manner, wherein successive selected radial lines are spaced by an integral multiple of the baseline angular increment;
acquiring k-space data along the selected radial lines; and
reconstructing at least one image of a subject based on the acquired k-space data.

* * * * *